United States Patent
Pradeep et al.

(10) Patent No.: US 6,821,904 B2
(45) Date of Patent: Nov. 23, 2004

(54) METHOD OF BLOCKING NITROGEN FROM THICK GATE OXIDE DURING DUAL GATE CMP

(75) Inventors: Yelehanka Ramachandramurthy Pradeep, Singapore (SG); Sanford Chu, Singapore (SG); Chit Hwei Ng, Singapore (SG); Jia Zhen Zheng, Singapore (SG); Purakh Verma, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 161 days.

(21) Appl. No.: 10/209,151

(22) Filed: Jul. 30, 2002

(65) Prior Publication Data

US 2004/0023506 A1 Feb. 5, 2004

(51) Int. Cl.[7] ............................................. H01L 21/302
(52) U.S. Cl. ....................... 438/706; 438/710; 438/720; 438/766; 438/769
(58) Field of Search ................................ 438/706, 710, 438/712, 720, 765, 766, 769

(56) References Cited

U.S. PATENT DOCUMENTS

| | | | |
|---|---|---|---|
| 5,254,489 A | 10/1993 | Nakata | 437/40 |
| 6,110,842 A * | 8/2000 | Okuno et al. | 438/776 |
| 6,261,972 B1 | 7/2001 | Tews et al. | 438/766 |
| 6,303,521 B1 | 10/2001 | Jenq | 438/770 |
| 6,331,492 B2 * | 12/2001 | Misium et al. | 438/762 |
| 6,589,877 B1 * | 7/2003 | Thakur | 438/703 |

* cited by examiner

*Primary Examiner*—Lan Vinh
(74) *Attorney, Agent, or Firm*—George D. Saik; Rosemary L. S. Pike

(57) ABSTRACT

In accordance with the objectives of the invention a new method is provided for the creation of layers of gate oxide having an unequal thickness. Active surface regions are defined over the surface of a substrate, a thick layer of gate oxide is grown over the active surface. A selective etch is applied to the thick layer of gate oxide, selectively reducing the thickness of the thick layer of gate oxide to the required thickness of a thin layer of gate oxide. The layer of thick gate oxide is blocked from exposure. $N_2$ atoms are implanted into the exposed surface of the thin layer of oxide, rapid thermal processing is performed and the blocking mask is removed from the surface of the thick layer of gate oxide. A high concentration of nitride has now been provided in the thin layer of gate oxide.

34 Claims, 3 Drawing Sheets

METHOD OF BLOCKING NITROGEN FROM THICK GATE OXIDE DURING DUAL GATE CMP

BACKGROUND OF THE INVENTION (1) Field of the Invention

The invention relates to the fabrication of integrated circuit devices, and more particularly, to a method for the creation of layers of different thickness gate oxide for application in the creation of dual gate electrodes.

(2) Description of the Prior Art

Improved semiconductor performance of semiconductor devices has been made possible by improvements in a range of related technologies, in device designs and in device packaging approaches.

The creation of many of the semiconductor devices starts with the growing of a layer of gate oxide over the surface where the device is to be located. The gate oxide is a thin thermal oxide, which allows better adhesion between the overlying layers (for instance nitride) and the (underlying) silicon and acts as a stress relaxation layer during field oxidation. Gate oxide can be formed by thermal oxidation of the underlying silicon and can also be formed in conjunction with a deposited oxide layer, nitride layer or any other material suitable for use as a gate dielectric. Gate oxide is usually formed as a silicon dioxide material but may be a composite oxide, such as TEOS and silicon dioxide, or a nitride oxide layer or a like gate dielectric. A gate oxide layer can for instance be grown in an oxidation steam ambient at a temperature between about 850 and 1,000 degrees C. to a thickness between about 10 and 250 Angstrom.

Device performance is highly dependent on the thickness of the layer of gate oxide. In devices that combine Field Effect Transistor (FET) devices with surrounding logic devices, the combined function that is provided by one semiconductor device requires the deposition of gate oxide layers of different thickness. Typically, surrounding logic functions require the use of a thin layer of gate oxide to enhance overall device performance while a thicker gate oxide is required in view of the required higher gate voltage for the FET access transistor of DRAM cells. As an example, with a voltage bias of about 2 volts of the substrate on which a FET memory device is created, a voltage difference of about 5 volts is required between the gate electrode and the substrate resulting in a gate voltage of 7 volts for the FET access transistor of the memory cells. The FET devices of the logic portion of the circuit however require a gate voltage of about 3.3 volts, making it clear that layers of pad oxide are required for these devices that are of different thickness.

Another application where gate oxide layers of different thickness is required is in the application of MOS devices where combined PMOS and NMOS devices are created that form a converter. The majority carriers of PMOS devices are holes; the majority carriers of NMOS devices are electrons. Holes have a considerable lower mobility than electrons resulting in a lower drive capability of the PMOS device. To compensate for this and to equalize the drive capability of the two types of devices, either the gate of the PMOS device is widened (allowing more drive current for a given gate voltage) or the thickness of the gate oxide layers for the two types of devices is adjusted allowing for higher gate current while maintaining gate widths the same. Of these two solutions, the varying of the thickness of the gate oxide is the more promising since the widening of the gate electrode requires surface area, which is contrary to the desire of miniaturization of the devices.

The invention addresses a method of creating layers of gate oxide of different thickness whereby a first, relatively thick layer is created and which is then partially and selectively reduced in thickness in order to create the relatively thin layer of gate oxide. The invention specifically addresses the desire for the presence of $N_2$ in the oxide of the layer of gate oxide since this presence provides improved signal to noise performance of the created gate electrodes.

U.S. Pat. No. 6,110,842 (Okuno et al.) shows a dual gate process using nitridation.

U.S. Pat. No. 5,254,489 (Nakata) shows a dual gate dielectric process by forming first and second oxide films using nitridation.

U.S. Pat. No. 6,303,521 B1 (Jenq) reveals a multi-thickness gate dielectric process.

U.S. Pat. No. 6,261,972 B1 (Tews et al.) discloses another dual gate oxide process.

SUMMARY OF THE INVENTION

A principle objective of the invention is to create a layer of gate oxide that does not have a negative effect of the signal-to-noise performance of the therewith-created gate electrode.

Another objective of the invention is to create layers of gate oxide having a different thickness whereby the relatively thin layer of gate oxide is provided with a higher concentration of nitrogen, thereby improving the signal-to-noise performance of the gate electrode created with the thin layer of gate oxide.

In accordance with the objectives of the invention a new method is provided for the creation of layers of gate oxide having an unequal thickness. Active surface regions are defined over the surface of a substrate, a thick layer of gate oxide is grown over the active surface. A selective etch is applied to the thick layer of gate oxide, selectively reducing the thickness of the thick layer of gate oxide to the required thickness of a thin layer of gate oxide. The layer of thick gate oxide is blocked from exposure. $N_2$ atoms are implanted into the exposed surface of the thin layer of oxide, rapid thermal processing is performed and the blocking mask is removed from the surface of the thick layer of gate oxide. A high concentration of nitride has now been provided in the thin layer of gate oxide.

DESCRIPTION OF THE PREFERRED EMBODIMENTS

It is clear that the combination of providing different functions within the design of one semiconductor device brings with it the requirement for different thickness of the gate oxide layer. Typically, high voltage devices such as program and erase transistors require a relative thick layer of gate oxide that protects the device against high voltage breakdown. Where however device speed is important, a thin layer of oxide is required, operating speed is enhanced with a thin layer of oxide combined with a narrow gate structure (short channel length). These latter requirements gain further importance where devices with micron or sub-micron device features are implemented.

Prior Art methods of forming oxide layers of different thickness use multiple steps of masking and oxide etch. The first layer created in this manner, typically the thickest layer, is initially grown on the surface of the substrate. This layer is masked with a layer of photoresist and etched thereby removing the unmasked layer of oxide from the substrate. The mask of photoresist is removed; a second layer of oxide is then grown over the surface of the substrate including the remaining first layer of oxide. This process results in a layer of oxide that has two thickness levels. This process can be repeated for the application where more than two levels of thickness are required, using a sequence of steps of deposition and etch. This process however suffers from the disadvantage of many sequential processing steps while the repeated use of photoresist, which is not easy to completely remove, results in layers of oxide of poor quality. Partial etch back of a deposited layer of oxide can also be used but this method too suffers from the same disadvantages.

The invention addresses a method of creating thin and thick layers of gate oxide that starts with a thick layer of gate oxide, this thick layer of gate oxide is selectively etched to create a thin layer of gate oxide. Specifically, the invention addresses a method for improved device performance by selectively implanting $N_2$ atom into a desired gate oxide layer, thereby improving the signal to noise ratio of this gate oxide layer and hence improving the therewith associated gate electrode performance.

Figure 1:
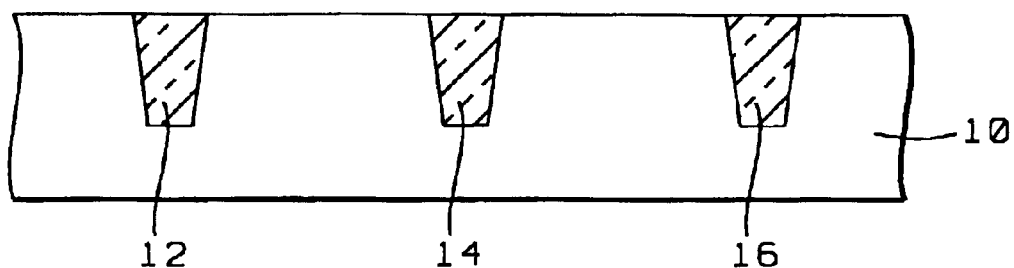
FIG. 1 is a cross section of a substrate in the surface of which regions of field isolation have been created.

Referring now specifically to FIG. 1, there is shown a cross section of a semiconductor surface 10, preferably the surface of a silicon substrate. Active surface regions have been defined over the surface of layer 10 by the creation of regions of field isolation 12, 14 and 16 whereby the regions 12 and 14 of field isolation bound the surface area of the substrate 10 over which a thin layer of gate oxide is to be created while the regions 14 and 16 of field isolation bound the surface area of the substrate 10 over which a thick layer of gate oxide is to be created.

STI regions 12, 14 and 16 can be made using a variety of methods. For instance, one method is the Buried Oxide (BOX) isolation used for shallow trenches. The method involves filling the trenches with a chemical vapor deposition (CVD) silicon oxide ($SiO_2$) and then etched back or mechanically or chemically polished to yield a planar surface. The shallow trenches etched for the BOX process are anisotropically plasma etched into the silicon substrate and are typically between 0.3 and 0.8 micrometer (um.) deep. STI are formed around the active device to a depth between 4,000 and 20,000 Angstrom.

Another approach in forming STI regions is to deposit silicon nitride on thermally grown oxide. After deposition of the nitride, a shallow trench is etched into the substrate using a mask. A layer of oxide is then deposited into the trench so that the trench forms an area of insulate dielectric which acts to isolate the devices in a chip and thus reduce the cross talk between active devices. The excess deposited oxide must be polished off and the trench planarized to prepare for the next level of metalization. The silicon nitride is provided to the silicon to prevent polishing of the masked silicon oxide of the device.

Figure 2:
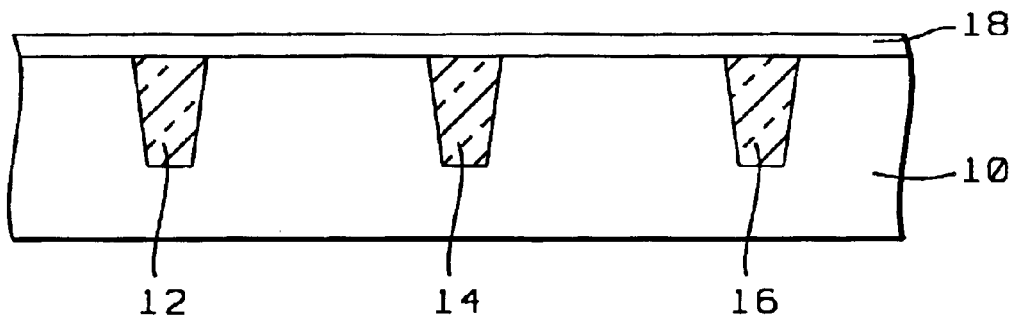
FIG. 2 is a cross section of the substrate after a thick layer of gate oxide has been formed over the surface thereof.

A thick layer 18, FIG. 2, of gate oxide is grown over the surface of layer 10. The layer 18 of gate oxide is grown over the bare silicon 10 after the silicon surface has been cleaned. The layer consists of a between about 100 and 200 Angstrom thick layer of $SiO_2$ and can be thermally grown over the surface of the wafer. Typically, a layer 18 of gate oxide can be formed in an oxidation steam ambient at a temperature between about 850 and 1000 degrees C. for a time period of about 10 to 20 minutes.

Gate oxide can be formed by thermal oxidation of the underlying silicon and can also be formed in conjunction with a deposited oxide layer, nitride layer or any other material suitable for use as a gate dielectric.

Figure 3:
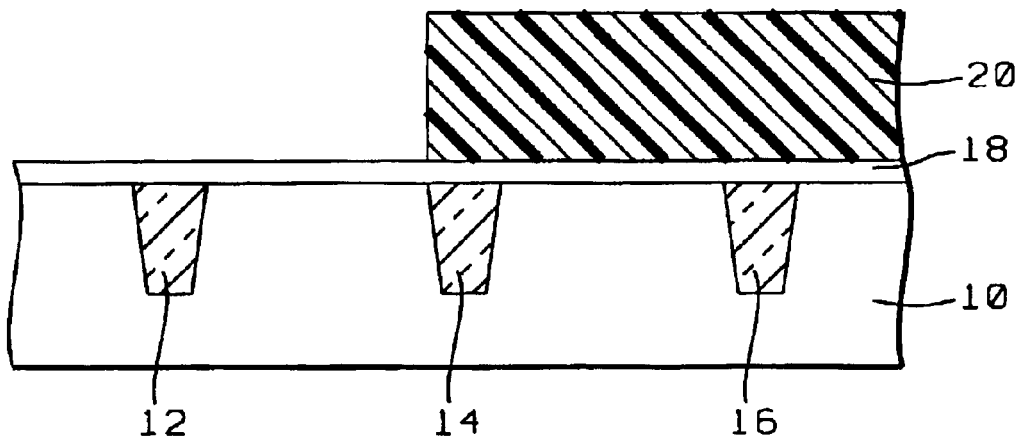
FIG. 3 is a cross section of the substrate after an exposure mask has been created over the surface of the thick layer of gate oxide.

A photoresist mask 20, FIG. 3, is then created over the surface of the layer 18 of gate oxide in order to reduce the thickness of layer 18 of gate oxide where a thin layer of gate oxide is required, that is over the active surface area of substrate 10 bounded by STI regions 12 and 14.

The deposition and patterning of the layer 20 of photoresist uses conventional methods of deposition and photolithography that are well known in the art. Photoresist stripping frequently uses sulfuric acid ($H_2SO_4$) and mixtures of $H_2SO_4$ with other oxidizing agents such as hydrogen peroxide ($H_2O_2$), the same components are frequently used in cleaning a wafer surface after the photoresist has been stripped.

Figure 4:
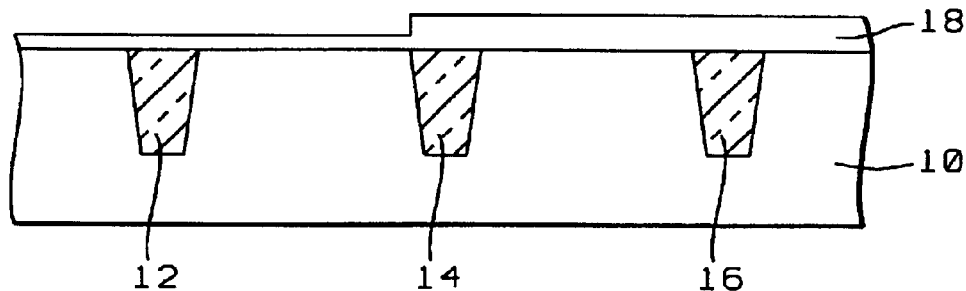
FIG. 4 is a cross section of the substrate after the thick layer of gate oxide has been selectively etched in accordance with the exposure mask, the exposure mask has been removed from the surface.

The etch of the thick layer 18 of gate oxide, FIG. 4, can be accomplished by dipping the specimen in slope for the duration of between about 3 and 5 seconds. Slope is a chemical compound containing HF, DT water and $CH_3COOH$. This reduces the thickness of layer 18 over the surface area that is exposed by the photoresist mask from between about 100 and 200 Angstrom to between about 40 and 70 Angstrom. This thickness is highly design dependent and is given at this time only as an example without thereby limiting the scope of the invention.

Figure 5:
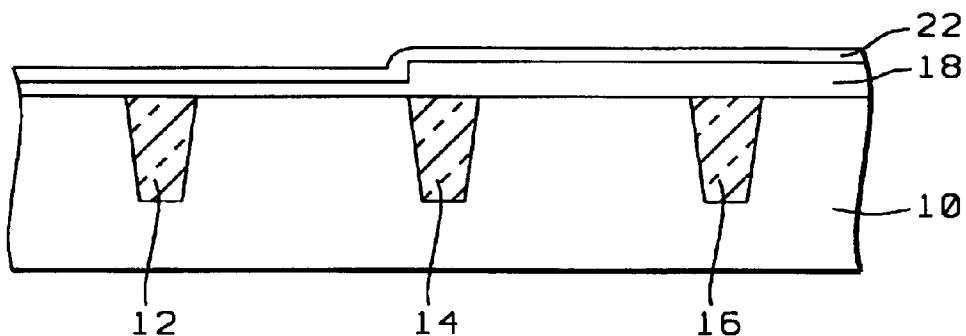
FIG. 5 is a cross section of the substrate after a thin layer of gate material has been blanket deposited.

The cross section that is shown in FIG. 5 shows that next a thin, between about 20 and 80 Angstrom, layer 22 of polysilicon is deposited over the surface of the structure that is shown in cross section in FIG. 4. The layer 22 is not limited to being polysilicon but can comprise any gate material such as for example oxide-based materials, nitride based materials or SiGe. Layer 22 of polysilicon can be grown at a temperature between 600 and 640 degrees C. using LPCVD.

The following comments apply, at significant advantage to the invention, to the deposition of layer 22:

Layer 22 prevents surface damage during a subsequent step of $N_2$ atom implantation to the surface of the thin layer 18 of gate oxide overlying the surface of substrate 10 that is bounded by STI regions 12 and 14

By selecting a gate material for the deposition of layer 22, this layer does not need to be removed prior to additional processing steps of creating overlying gate electrodes but can readily be integrated into these processing steps Because layer 22 is deposited to a thickness of only between about 25 and 80 Angstrom, layer 22 does not form a barrier to the penetration of $N_2$ atoms through this layer 22, and Layer 22, in combination with the selection of $N_2$ implantation parameters such as $N_2$ atom energy and density, can serve as an added control for the desired distribution and penetration of $N_2$ atoms into the underlying layer 18 of gate oxide; the $N_2$ atoms will pass through the layer 22 but in doing so can lose enough energy and can disperse in such a manner that a desired $N_2$ atom profile can be created in the thin layer 18 of gate oxide.

Figure 6:
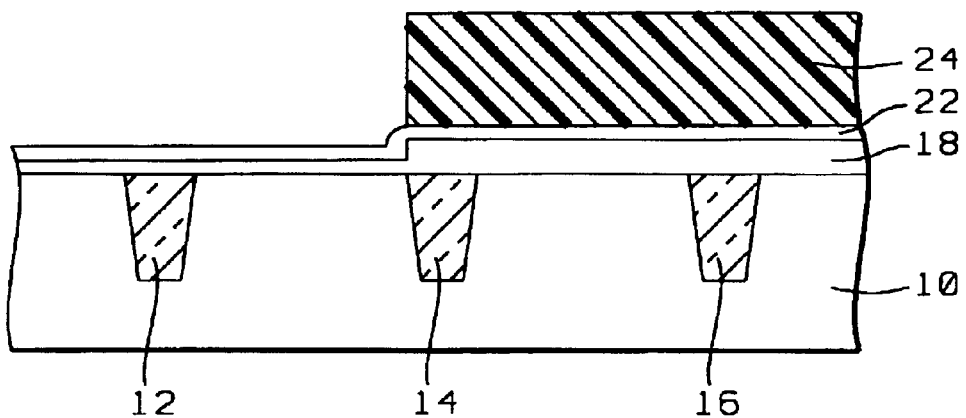
FIG. 6 shows a cross section of the substrate after a second blocking mask has been created.

The surface region that aligns with the created thick layer of gate oxide is now blocked with a second photoresist mask 24 as shown in cross section in FIG. 6, this mask serves as a blocking mask for a following implantation of $N_2$ ions. Any other suitable blocking mask can also be used for this purpose such as a silicon oxide hard mask that can be removed at a later time applying isotropic plasma etching in an etchant comprising fluorocarbons, performed in a parallel HDP reactor in-situ, in a plasma containing $CF_4$ at a flow rate of between about 30 and 60 sccm, in an organ carrier gas at a flow rate sufficient to maintain a pressure between about 5 and 15 mTorr said HDP reactor and at an rf power of between about 400 and 1,200 Watts TCP and between about 1,000 and 1,500 Watts bias.

Figure 7:
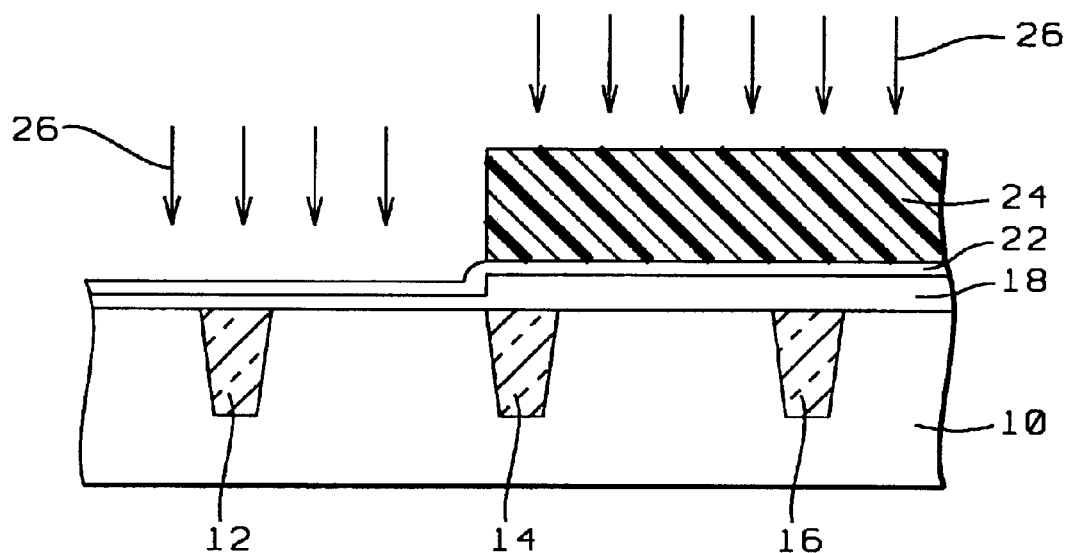
FIG. 7 shows a cross section during $N_2$ atom implantation though the exposed surface of the layer of gate material into the underlying thin layer of gate oxide.

The surface of the structure that is created as shown in cross section in FIG. 6 is now exposed to $N_2$ doping 26, FIG. 7, into the layer of oxide that has previously been reduced in thickness, that is the layer 18 of gate oxide that aligns with and overlies the surface area of substrate 10 that is bounded by field isolation regions 12 and 14, as shown in the cross section of FIG. 7.

The source of nitrogen for the plasma exposure 26, which is preferably a high density plasma, may be a nitrogen containing gas that is generated by a number of sources. For instance, one of the following sources may be used: helical generator, helicon, electron-cyclotron resonance or inductively coupled. During the plasma treatment 26, the substrate 10 may be unbiased in which case the ionized substances are accelerated by the plasma potential which is typically in the order of 20 Volts after which the $N_2$ substances are implanted into the layer 22 of gate oxide where this layer has been reduced in thickness and as determined by mask 24. For further acceleration of the ions of the plasma, the substrate may be biased, using either a DC or a RF bias. As processing conditions for the plasma treatment 26 can be cited applying a plasma density between about 1E10 and 1E12 atoms/$cm^3$, a nitrogen flow of between about 50 and 1,800 sccm, at a pressure between about 10 and 350 Torr, a temperature between about 50 and 500 degrees C., a substrate bias between about 0 and 50 Volts, for a duration of between about 1 and 60 seconds. The substrate bias may be replaced by applying an energy between about 50 to 220 keV to the plasma.

The nitride flow of the plasma exposure 26 can be created using a precursor gas that is selected from a group of nitride containing gasses such as $N_2$, $NH_3$, NO, $N_2O_2$ or a mixture thereof applied with or without an inert gas such as Ne, Kr, Xe, CO, $CO_2$, He, Ar, $N_2$ and mixtures thereof.

The plasma nitridation 26 causes nitrogen to be implanted into the thin layer 18 where this layer is overlying the surface of the substrate 10 that is bounded by STI regions 12 and 14. This causes improved performance of the gate electrode that is created over the thin layer of gate oxide by providing an improved signal to noise ratio at high frequency operation of a CMOS gate electrode that is overlying and using this thin nitrided layer of gate oxide.

After the step 26 of $N_2$ doping has been completed, rapid thermal processing (RTP) is performed at a temperature between about 800 and 1000 degrees C. for a time between about 10 and 20 seconds thereby forming a thin layer of nitrogen gate oxide with a thickness between about 40 and 70 Angstrom.

The second photoresist mask 24, FIG. 7, can then be removed from the surface after which the structure is ready for further processing for the creation of gate electrodes over the surface thereof.

To summarize the invention:

A substrate is provided

A first and a second active region are created over the surface of the substrate by creating regions of STI in the surface thereof; the first active region is designated as the region over which a thick layer of gate oxide is desired, the second active region is designated as the region over which a thin layer of gate oxide is desired A thick layer of oxide is created over the surface of the substrate, thereby including the first and the second active regions over the surface of the substrate The thickness of the thick layer of oxide is reduced over the second active region of the substrate, creating a thin layer of oxide over the surface thereof, leaving in place a thick layer of oxide over the first active region of the substrate A thin layer of gate material is deposited over the thin and the thick layers of oxide A plasma exposure blocking mask is created overlying the thick layer of oxide The thin layer of gate material is exposed to a nitrided plasma thereby implanting nitride atoms into the underlying thin layer of oxide The plasma exposure blocking mask is removed, and RTP is performed for $N_2$ plasma immersion.

The thin layer of gate oxide and the thick layer of oxide with the thereover deposited thin layer of gate material can now be used for the creation of gate electrodes of the surface thereof, preferably creating a CMOS device over the surface of the thin layer of gate oxide; the created CMOS device will have improved signal-to-noise performance characteristic at high frequency operation of the CMOS device, and Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating thin and thick layers of gate oxide while controlling the nitride concentration in the created layers of gate oxide, comprising the steps of:

providing a substrate;

creating at least one first active and at least one second active surface region over said substrate;

growing a layer of oxide having a first thickness over said substrate;

etching said layer of oxide overlying said at least one second active surface region, thereby reducing said first thickness to a second thickness;

depositing a layer of gate material having a third thickness over said layer of oxide;

creating a plasma exposure blocking mask over said layer of gate material, said plasma exposure blocking mask overlying said layer of oxide having a first thickness;

performing nitride doping into said layer of oxide having a second thickness;

performing a step of rapid thermal processing; and removing the plasma exposure blocking mask.

2. The method of claim 1, said creating at least one first active and at least one second active surface region over said substrate comprising forming regions of field isolation oxide in said substrate.

3. The method of claim 1, said first thickness being between about 100 and 200 Angstrom.

4. The method of claim 1, said second thickness being between about 40 and 70 Angstrom.

5. The method of claim 1, said third thickness being between about 20 and 80 Angstrom.

6. The method of claim 1, said etching said layer of oxide overlying said at least one first active comprising:

depositing a layer of photoresist over said layer of oxide;

patterning and developing said layer of photoresist, creating a developed layer of photoresist overlying said layer of oxide, said developed layer of photoresist and being aligned with said at least one first active surface region created over said substrate.

7. The method of claim 1, said plasma exposure blocking mask comprising a material selected from the group consisting of photoresist and oxide hard mask material.

8. The method of claim 1, said nitride doping having a plasma density between about 1E10 and 1E12 atoms/cm$^3$.

9. The method of claim 1, said nitride doping comprising a nitride flow of between about 50 and 1,800 sccm.

10. The method of claim 1, said nitride doping being performed at a pressure between about 10 and 350 Torr.

11. The method of claim 1, said nitride doping being performed at a temperature between about 50 and 500 degrees C.

12. The method of claim 1, said nitride doping while applying a substrate bias between about 0 and 50 Volts.

13. The method of claim 1, said nitride doping being performed for a duration of between about 1 and 60 seconds.

14. The method of claim 1, said nitride doping being performed while applying a substrate bias of 0 Volts and by applying an energy between about 50 to 220 keV to the plasma.

15. The method of claim 1, said nitride doping using a precursor gas selected from the group consisting of $N_2$ and $NH_3$ and NO and $N_2O_2$ and a mixture thereof.

16. The method of claim 1, said nitride doping using an inert gas.

17. The method of claim 1, said rapid thermal processing being performed at a temperature between about 800 and 1000 degrees C. for a time between about 10 and 20 seconds.

18. A method of creating thin and thick layers of gate oxide while controlling the nitride concentration in the created layers of gate oxide, comprising the steps of:

providing a substrate;

creating at least one first active and at least one second active surface region over said substrate;

growing a layer of oxide having a first thickness over said substrate, thereby including said at least one first active and at least one second active surface region;

creating a first etch resist mask over said layer of oxide, said first etch resist mask being aligned with said at least one first active surface region;

etching said layer of oxide in accordance with said first etch resist mask, thereby reducing said first thickness to a second thickness, thereby creating at least one first layer of oxide having a first thickness overlying said at least one first active surface region in addition to creating at least one second layer of oxide having a second thickness overlying said at least one second active surface region;

removing said first etch resist mask;

depositing a layer of gate material having a third thickness over said layer of oxide, thereby including said at least one first layer of oxide and said at least one second layer of oxide;

creating a second plasma exposure blocking mask over said layer of gate material, said second plasma exposure blocking mask overlying said at least one first layer of oxide;

performing nitride doping into said at least one second layer of oxide;

performing a step of rapid thermal processing; and removing the second plasma exposure blocking mask.

19. The method of claim 18, said creating at least one first active and at least one second active surface region over said substrate comprising forming regions of field isolation oxide in said substrate.

20. The method of claim 18, said first thickness being between about 100 and 200 Angstrom.

21. The method of claim 18, said second thickness being between about 40 and 70 Angstrom.

22. The method of claim 18, said third thickness being between about 20 and 80 Angstrom.

23. The method of claim 18, said first etch resist mask comprising photoresist.

24. The method of claim 18, said second plasma exposure blocking mask comprising a material selected from the group consisting of photoresist and oxide hard mask material.

25. The method of claim 18, said nitride doping having a plasma density between about 1E10 and 1E12 atoms/cm$^3$.

26. The method of claim 18, said nitride doping comprising a nitride flow of between about 50 and 1,800 sccm.

27. The method of claim 18, said nitride doping being performed at a pressure between about 10 and 350 Torr.

28. The method of claim 18, said nitride doping being performed at a temperature between about 50 and 500 degrees C.

29. The method of claim 18, said nitride doping while applying a substrate bias between about 0 and 50 Volts.

30. The method of claim 18, said nitride doping being performed for a duration of between about 1 and 60 seconds.

31. The method of claim 18, said nitride doping being performed while applying a substrate bias of 0 Volts and by applying an energy between about 50 to 220 keV to the plasma.

32. The method of claim 18, said nitride doping using a precursor gas selected from the group consisting of $N_2$ and $NH_3$ and NO and $N_2O_2$ and a mixture thereof.

33. The method of claim 18, said nitride doping using an inert gas.

34. The method of claim 18, said rapid thermal processing being performed at a temperature between about 800 and 1000 degrees C. for a time between about 10 and 20 seconds.

* * * * *